US012672523B2

(12) United States Patent
Pachamuthu et al.

(10) Patent No.: US 12,672,523 B2
(45) Date of Patent: *Jun. 30, 2026

(54) SYSTEM AND METHOD FOR DIE CRACK DETECTION IN WAFER-TO-WAFER BONDING

(71) Applicant: Sandisk Technologies, Inc., Milpitas, CA (US)

(72) Inventors: Jayavel Pachamuthu, San Jose, CA (US); Kirubakaran Periyannan, Santa Clara, CA (US); Daniel J. Linnen, Naperville, IL (US); Stephen Skala, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 514 days.

This patent is subject to a terminal disclaimer.

(21) Appl. No.: 18/222,057

(22) Filed: Jul. 14, 2023

(65) Prior Publication Data

US 2024/0249984 A1     Jul. 25, 2024

Related U.S. Application Data

(60) Provisional application No. 63/440,719, filed on Jan. 24, 2023.

(51) Int. Cl.
*H10P 74/00*     (2026.01)
*H10D 1/68*     (2025.01)
*H10W 42/00*     (2026.01)

(52) U.S. Cl.
CPC ............. *H10P 74/277* (2026.01); *H10D 1/68* (2025.01); *H10W 42/00* (2026.01)

(58) Field of Classification Search
CPC ....... H10B 80/00; H10P 74/277; H10P 74/23; H10P 74/207; H10D 1/68; H10W 42/00; H10W 90/00; H10W 90/297
See application file for complete search history.

(56) References Cited

U.S. PATENT DOCUMENTS

| | | |
|---|---|---|
| 9,431,338 B2 | 8/2016 | Priel et al. |
| 11,450,575 B2 | 9/2022 | Pachamuthu et al. |
| 2005/0023656 A1 | 2/2005 | Leedy |
| 2015/0226579 A1* | 8/2015 | Nino .................. G01M 5/0083 |
| | | 324/537 |
| 2017/0125360 A1 | 5/2017 | Lee |
| 2018/0047644 A1* | 2/2018 | Davis ................ G01R 31/2853 |
| 2019/0033365 A1 | 1/2019 | Sanchez |
| 2022/0367406 A1* | 11/2022 | Chang .................. H10W 90/00 |
| 2023/0197638 A1* | 6/2023 | Kabir .................. H10W 42/00 |
| | | 257/700 |

* cited by examiner

*Primary Examiner* — Jacob Y Choi
*Assistant Examiner* — Neil R Prasad
(74) *Attorney, Agent, or Firm* — Crowell & Moring LLP

(57) ABSTRACT

In wafer-to-wafer bonding, a first die is bonded to a second die at a bonding interface. Various configurations of capacitors are placed along an inner portion of an edge seal of the bonded dies to detect a discontinuity in the bonding interface. These configurations include interdigitated capacitors, which can be horizontally or vertically oriented, parallel-digitated capacitors, and pillars forming a parameter around the dies with conductive portions offset from the pillar and extending inside the dies. Other configurations can be used.

15 Claims, 14 Drawing Sheets

800

810

Edge Seal (ES)

820

+

−

Horizontally
Inter-digitated Capacitor

900

930

910

920

1000

1100

1800

SYSTEM AND METHOD FOR DIE CRACK DETECTION IN WAFER-TO-WAFER BONDING

CROSS-REFERENCE TO RELATED APPLICATION

This application claims priority to U.S. provisional patent application No. 63/440,719, filed Jan. 24, 2023, which is hereby incorporated by reference.

BACKGROUND

In order to increase circuit density without increasing package size, a die may be directly attached or bonded to another die. For efficient assembly, two wafers, each having many dies, may be bonded together using wafer-to-wafer bonding technology, and the bonded dies can be later cut from the bonded wafers. For example, a wafer containing memory or NAND dies maybe be bonded to a wafer having control dies, which may be fabricated from complementary metal-oxide-semiconductor (CMOS) circuits. The resulting structure is referred to as a CMOS bonded array (CBA). A crack in the structure (e.g., created by warpage in one or both of the wafers, thermal stress, or dicing complications) can result in a die that is not functional.

DETAILED DESCRIPTION

The following embodiments generally relate to a system and method for die crack detection in wafer-to-wafer bonding. In one embodiment, an integrated circuit is provided comprising a memory die; a control die comprising control circuitry for the memory die, wherein the memory die and the control die are bonded together at a bonding interface; an edge seal surrounding the memory die and the control die; and a plurality of interdigitated capacitors located in an inner portion of the edge seal, wherein the plurality of interdigitated capacitors are configured to detect a discontinuity in the bonding interface between the memory die and the control die.

In another embodiment, a method is provided for detecting a discontinuity in a bonding interface between a memory die and a control die comprising control circuitry for the memory die. The method comprises applying a voltage across a plurality of parallel-digitated capacitors located in an inner portion of an edge seal surrounding the memory die and the control die, wherein the plurality of parallel-digitated capacitors comprise positive and negative nodes with lateral offsets; and detecting the discontinuity in the bonding interface between the memory die and the control die by comparing a voltage across the plurality of parallel-digitated capacitors with a reference voltage.

In yet another embodiment, an integrated circuit is provided comprising: a memory die; a control die comprising control circuitry for the memory die, wherein the memory die and the control die are bonded together at a bonding interface; an edge seal surrounding the memory die and the control die; and means for detecting a discontinuity in the bonding interface between the memory die and the control die. Other embodiments are provided and can be used alone or in combination.

As mentioned above, various embodiments relate to wafer-to-wafer bonding and CMOS Bonded Array (CBA) architecture. CBA architecture is a developing technology that separates the complementary metal oxide semiconductor (CMOS) logic typically performed under a memory array in a "Circuit Under the Array" (CUA) architecture and implements it in a separate CMOS chip, which allows for faster operations. The CBA architecture can comprise one or more CMOS chips coupled to one or more arrays by way of one or more connection units, where the arrays correspond to one or more memory locations of a non-volatile memory, such as a first die of the plurality of dies of the memory. The CMOS device can also be a "Circuit Above the Array" (CAA) device. Because the CMOS device is separate from the array, the CMOS logic may be performed faster than a CUA device. In CBA and CAA architectures, the CMOS and array portions are placed in separate wafers using separate fabrication processes. This allows for better overall input-output (IO) performance, power, and cost, as well as enabling new ways to increase three-dimensional stacking.

Figure 1:
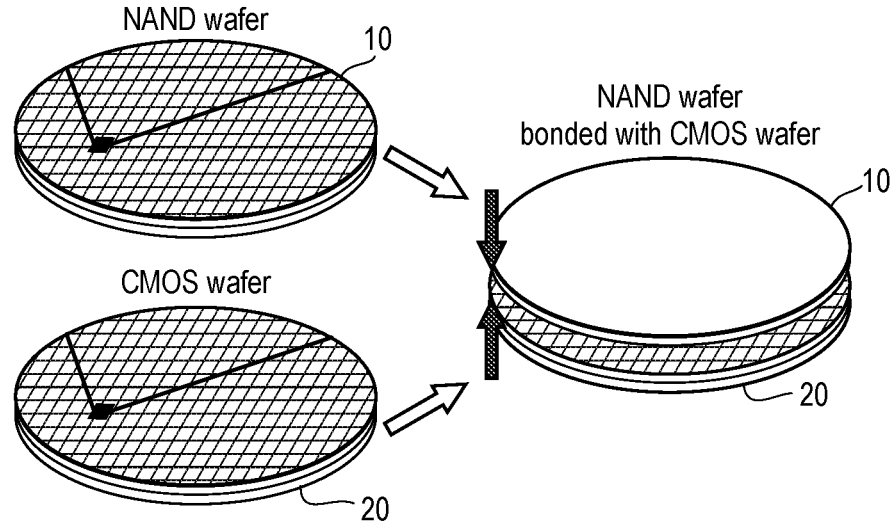
FIG. 1 is a diagram of two bonded wafers of an embodiment.

Turning now to the drawings, FIG. 1 is a diagram of two bonded wafers 10, 20 of an embodiment. The first and second wafers 10, 20 can take any suitable form. For example, in this embodiment, the first wafer 10 comprises a plurality of memory dies, each of the memory dies comprising a memory array (here, a NAND memory array), and the second wafer 20 comprises a plurality of control dies, each of the control dies comprising peripheral (control) circuitry for the memory arrays. In one embodiment, the control dies/second wafer comprise complementary metal-oxide-semiconductor (CMOS) circuitry. The peripheral circuitry can contain, for example, transistors, logic signals, and circuitry for controlling and driving memory elements to accomplish functions such as programming and reading. It should be noted that these are merely examples, and other implementations can be used.

The first and second wafers 10, 20 can be fabricated separately and then bonded together by bonding a plurality of contact pads of each of the wafers 10, 20 together. The resulting integrated circuit can yield one memory die or a plurality of memory dies, which can be diced to create individual memory dies. As a wafer can contain one or more than one die, the term "wafer," as used herein, is intended to broadly refer to an individual memory die or to a plurality of memory dies.

Figure 2:
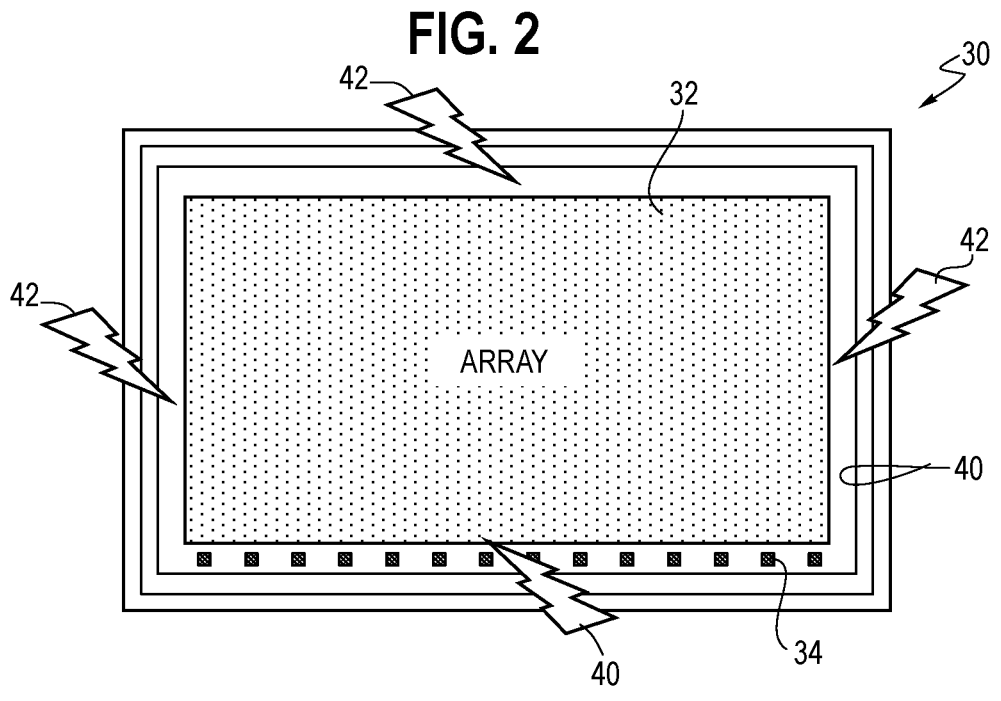
FIG. 2 is a top view of an integrated circuit of an embodiment.

FIG. 2 is a top view of an integrated circuit/die 30 after the first and second wafers 10, 20 have been bonded together, and the integrated circuit 30 has been diced from the bonded wafers. As shown in FIG. 2, a memory array 32 of the first wafer 10 is on the top of the bonded stack. The plurality of contacts 34 of the memory array 32 are shown in FIG. 2, and a corresponding plurality of contacts of the peripheral circuitry and the peripheral circuitry itself are located under the memory array 32 and, therefore, are not shown in FIG. 2. FIG. 2 also shows that the integrated circuit 30 in this example comprises an edge seal, which, in this embodiment, comprises three grounded metal walls or rings 40. While three walls 40 are shown in this example, it should be understood that fewer or more walls can be used. In general, the edge seal is positioned around the perimeter of the die 30 to seal the edge of the die 30 from contaminants (e.g., charged ions, radicals, or moisture) that can negatively affect yield during fabrication and/or negatively affect performance after fabrication.

Figure 3:
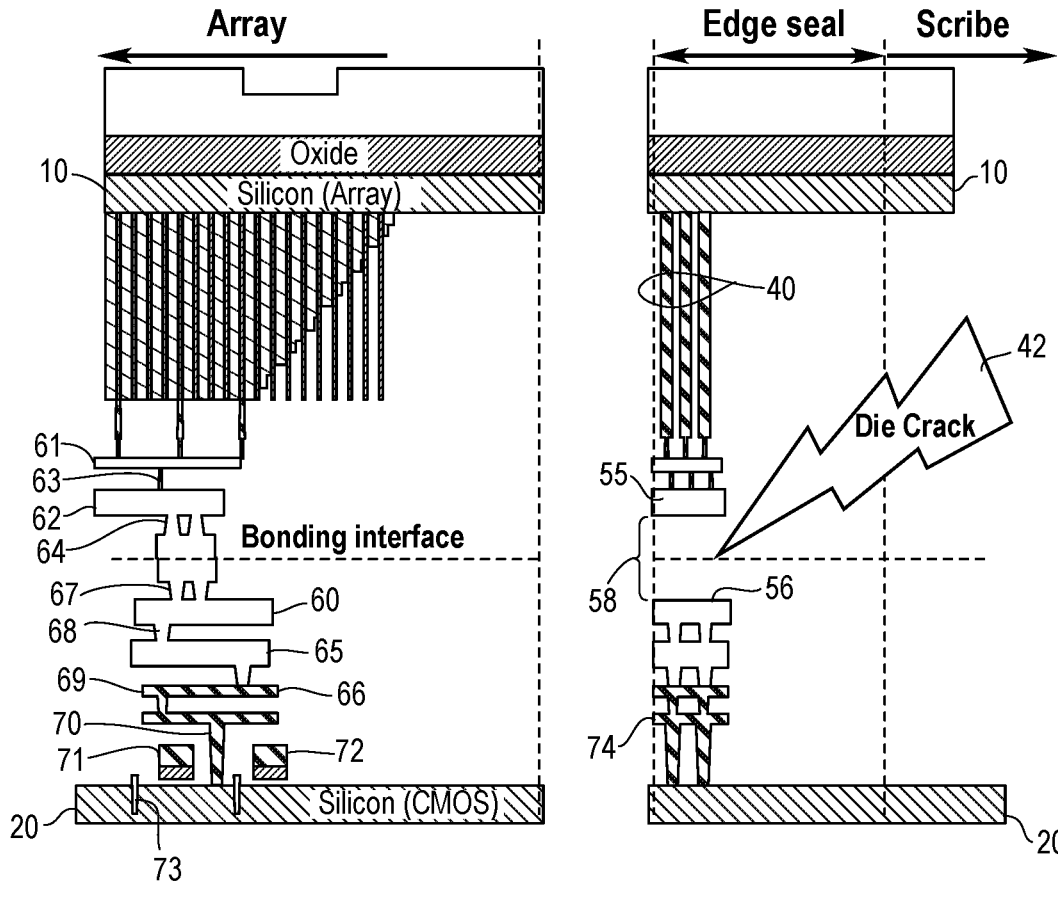
FIG. 3 is a cross-sectional view of an integrated circuit of an embodiment.

FIG. 3 is a cross-sectional view of the integrated circuit 30. As shown in FIG. 3, the first wafer 10 in this embodiment comprises an oxide layer, a silicon (array) layer, and the plurality of contacts 34, and the second wafer 20 comprises a silicon (CMOS) layer. The two wafers 10, 20 comprise structures that are bonded together at the bonding interfaces. The structures on the first wafer 10 comprise a plurality of metal wires 61, 62 and connecting metal-filled vertical interconnect access structures (vias) 63, 64. The structures on the second wafer 20 comprise a plurality of metal wires 60, 65, 66, connecting vias 67, 68, 69, a CMOS transistor 71, 72, a CMOS source/drain contact 70 to the CMOS transistor 71, 72, and shallow trench isolation 73.

FIG. 3 also shows the edge seal located at the edge of the die. To the right of the edge seal is the scribe line, where the die would be diced from the bonded wafers 10, 20. FIG. 3 shows that the three walls 40 noted above are in the portion of the edge seal that is located in the first wafer 10. As also shown in FIG. 3, there is a gap 58 between the metal structures 55, 56, 74 in the portions of the edge seal that are located in the first and second wafers 10, 20.

As illustrated by lightning bolts 42 in FIGS. 2 and 3, a crack in the edge seal can occur (e.g., at any location, not necessarily the shown locations of the bolts 42). A crack can be caused, for example, by warpage in one or both of the wafers 10, 20, thermal stress, dicing complications, or die handling complications. These problems can lead to a die crack 42 (discontinuity) at the bonding interface between the array wafer 10 and the CMOS wafer 20, as well as at the edge seal ring bonding interface. Moisture and other foreign particle contaminants can then seep through the crack and cause packaging reliability, cross temperate tests, and package yield concerns. Unfortunately, it can be difficult or impossible to detect this problem, and a serious yield issue can occur during packaging and cross-temperature tests. For example, many devices with this mode of fracture can pass a full functional test without any sign of an internal problem. Similarly, electrical open-shorts test will not detect die-crack.

U.S. Pat. No. 11,450,575, which is hereby incorporated by reference, discloses an integrated circuit where inner and outer edge seals have top and bottom parallel plate capacitors for crack detection in a CBA. The following embodiments provide other integrated circuits and methods for die-crack detection in a memory device. One advantage of at least some of these embodiments is that they can efficiently detect a die crack pre- and post-packaging and also in a multi-chip package (MCP) product. It should be noted that the embodiments discussed can be used in many wafer-to-wafer bonding architectures.

Figure 4:
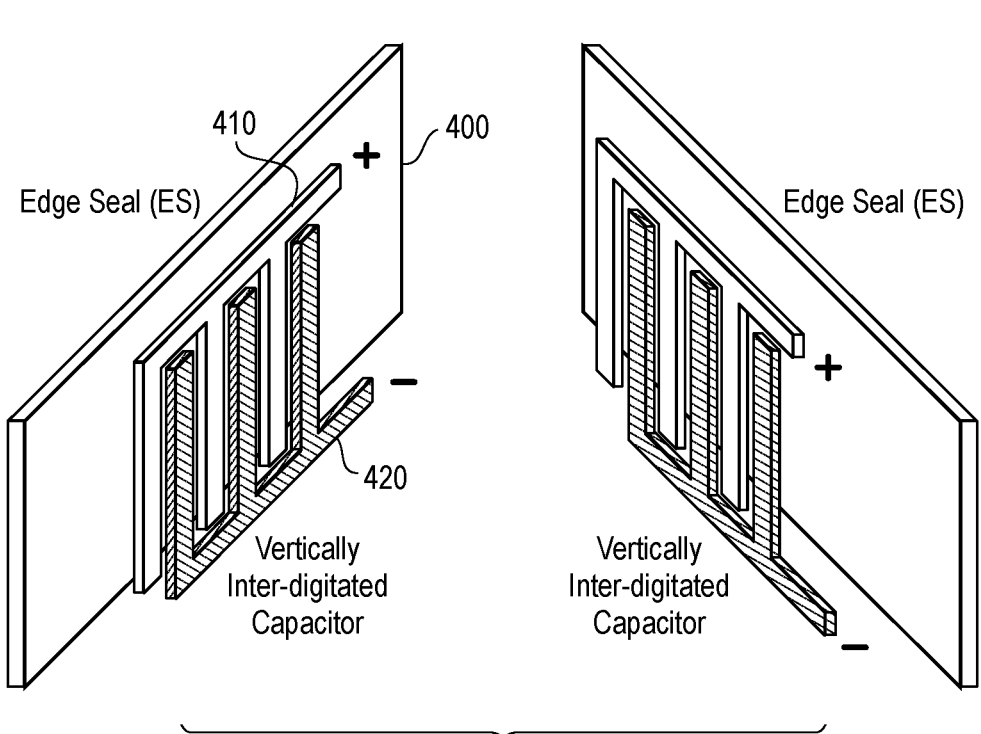
FIG. 4 is a diagram of a plurality of vertical interdigitated capacitors located in an inner portion of an edge seal of an integrated circuit of an embodiment.

Turning again to the drawings, FIG. 4 is a diagram of a plurality of vertically interdigitated capacitors 410, 420 located in an inner portion of an edge seal 400 (e.g., the inner edge seal ring) of an integrated circuit of an embodiment. (The outer solid edge seal prevents any moisture, impurities, or contaminants diffusing into the active array and peri transistors area.) FIG. 4 shows the interdigitated capacitors on two of the sides of the edge seal. However, it should be understood that the interdigitated capacitors can be on all four sides of the edge seal or on some different number of sides of the edge seal. The interdigitated capacitors can be in the memory die and/or control die.

Figure 5:
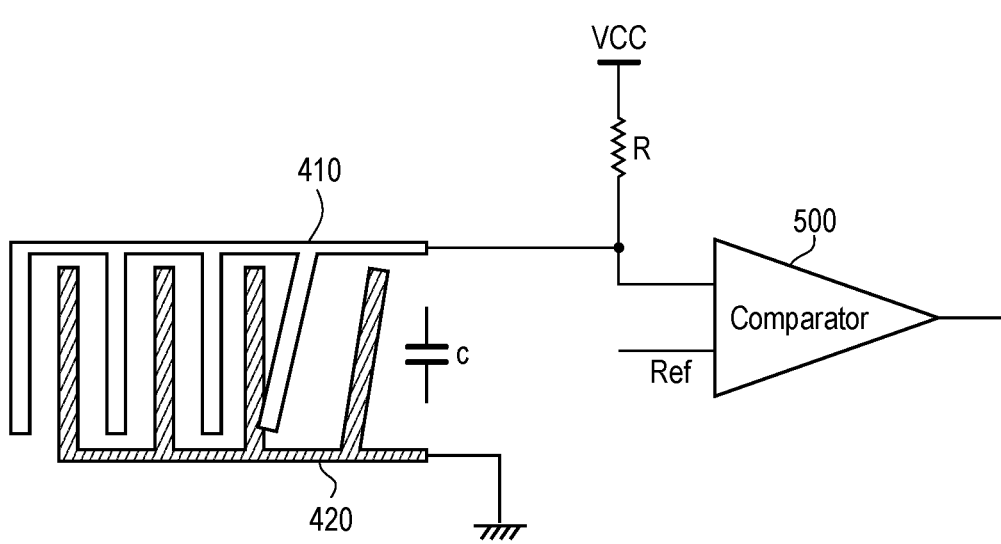
FIG. 5 is an illustration of a testing circuit of an embodiment where there is a short in interdigitated capacitors.
Figure 6:
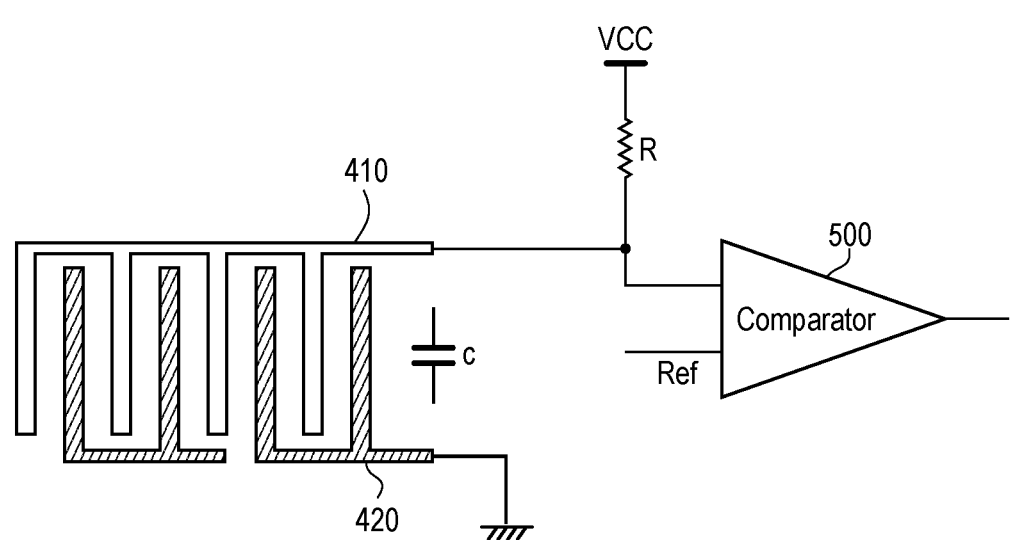
FIG. 6 is an illustration of a testing circuit of an embodiment where there is a break in interdigitated capacitors.

In this embodiment, since the capacitors are interdigitated, the sensitivity of the die-crack detection mechanism is increased to a higher degree of detection. This is illustrated in FIGS. 5 and 6, which show circuits that can be used in a die crack detection method using capacitance modulation. In this embodiment, an external testing contact can be electrically coupled with at least one of the plurality of interdigitated capacitors 410, 420 to detect a discontinuity in the bonding interface between the memory die and the control die. (FIGS. 7, 8A, 8B, and 8C in the '575 patent noted above show examples of how external testing contacts can be positioned and used.) For example, the positive and negative portions of the capacitors 410, 420 can be electrically connected to positive and negative external testing contacts that can be connected to a voltage source and ground, respectively. As another example, the negative contact can be connected to an existing ground in the integrated circuit, so only an external testing contact electrically coupled with the positive portion may be needed. Other variations are possible.

As shown in FIG. 5, to detect a crack or other fault in the bonding interface between the memory and control dies, a voltage (VCC) can be applied to one of the interdigitated capacitors 410, with the other interdigitated capacitor 420 grounded. A comparator 500 compares the voltage across the interdigitated capacitors 410, 420 with a reference voltage to detected whether there is a discontinuity in the bonding interface between the memory and control dies. For example, FIG. 5 shows a short due to a crack. In this situation, the voltage across the interdigitated capacitors 410, 420 will not rise beyond a certain value, which can be used as the reference voltage. As another example, FIG. 6 shows an opening in one of the capacitors 420 caused by a crack in the bonding interface. In this example, the intact capacitor 410 will quickly charge up. So, one or more processors (e.g., executing computer-readable program code stored in a computer-readable medium) can analyze the output of the comparator 500 to make a time-based measurement of how fast the comparator's output changes over time. This would be indicative of a crack.

Figure 7:
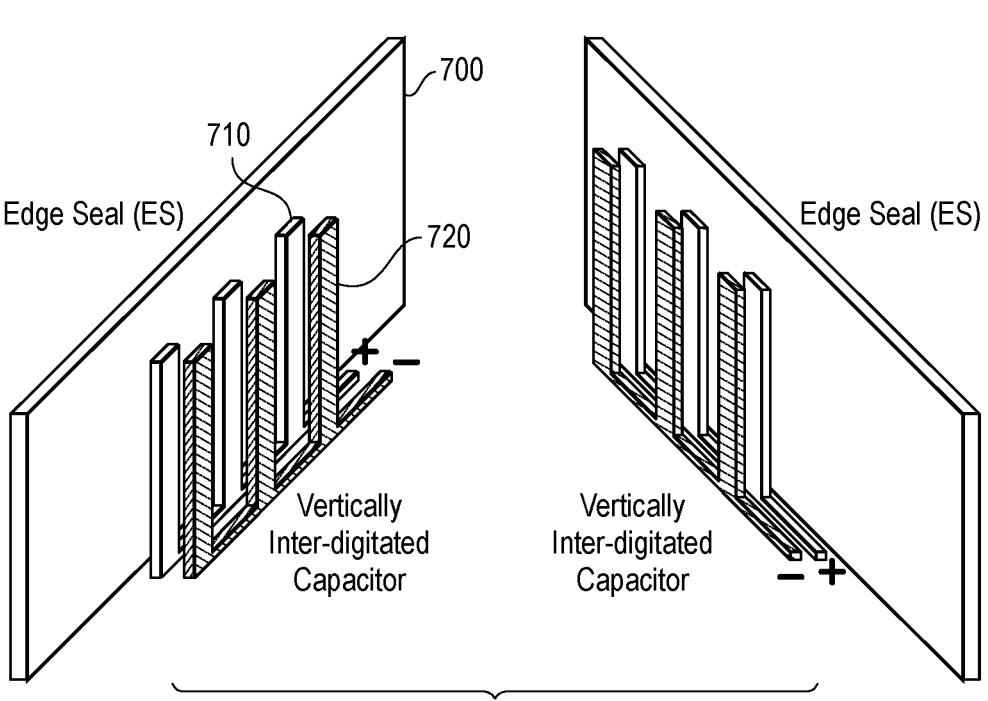
FIG. 7 is a diagram of parallel-digitated capacitors located in an inner portion of an edge seal of an integrated circuit of an embodiment.
Figure 8:
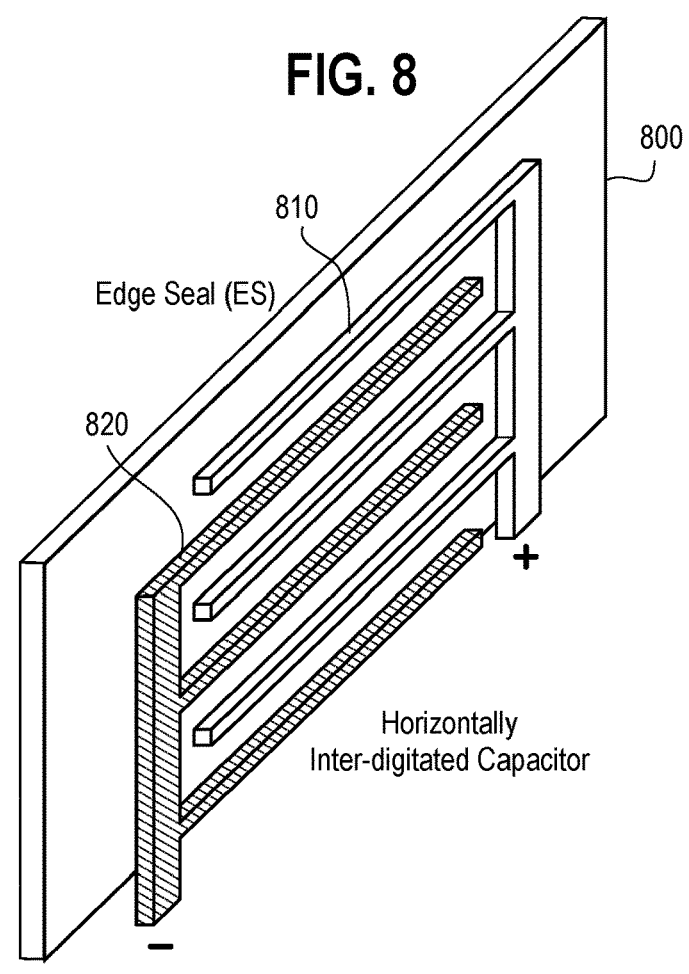
FIG. 8 is a diagram of a plurality of horizontally inter-digitated capacitors located in an inner portion of an edge seal of an integrated circuit of an embodiment.

There are many alternatives that can be used with these embodiments. For example, FIG. 7 shows an embodiment in which the inner seal 700 has vertically parallel-digitated capacitors 710, 720 for die-crack detection, where the positive and negative nodes of the parallel digitated capacitors 710, 720 have a lateral offset. As with the embodiment shown in FIG. 4, the parallel digitated capacitors 710, 720 are only shown on two sides of the inner seal 700, but all four sides (or some other number) can have parallel-digitated capacitors (or even some other orientation of capacitors). As also with the embodiment shown in FIG. 4, the capacitors can be on the memory die and/or control die. Using parallel-digitated capacitors can provide an advantage in die crack detection. For example, if one of the parallel digits breaks, it can modulate the capacitance to a higher degree than other configurations. Also, this digit construction can work well with standard via processing.

In yet another embodiment (shown in FIG. 8), the interdigitated capacitors 810, 820 on the edge seal 800 have a horizontal configuration. As with the embodiment shown in FIG. 4, the capacitors 810, 820 can be on all (e.g., all four) sides of the inner seal 900, and the capacitors 810, 820 can be on the memory die and/or control die. The digits of the capacitors 810, 820 can be formed at each metal level. In one embodiment, there are nine metal levels in the CBA, but more or fewer metals can be used (thus, more or fewer digits can be achieved). Also, in this embodiment, digits can be formed in the same metal levels with a lateral offset as in the embodiment discussed above.

Figure 9:
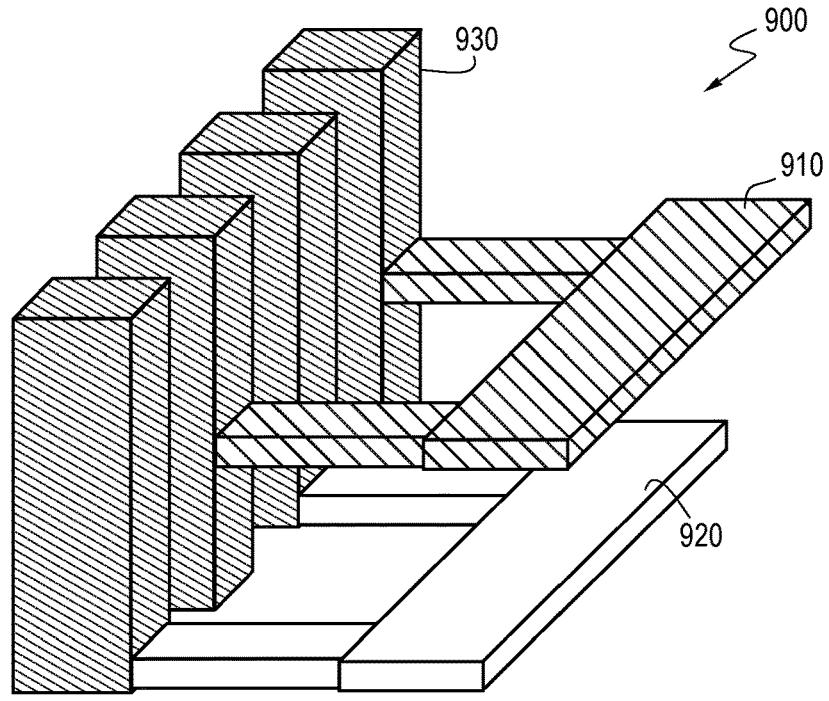
FIG. 9 is a diagram of a die crack detection technique of an embodiment using pillars/vias with buried metals.

Another embodiment uses pillars/vias with buried metals. This embodiment 900 is shown in FIG. 9. As shown in FIG. 9, in this embodiment, pillars 930 can form a perimeter around the chip, with metals 910, 920 being offset from them to be on the inside of the chip. This may work better with routing, and these pillars can be the result of via steps, including through-silicon via (TSV) or memory hole etches.

FIGS. 10-29 are illustrations of various other example implementations that can be used. It should be noted that these are merely examples, and the details of these implementations should not be read into the claims unless expressly recited therein.

Figure 10:
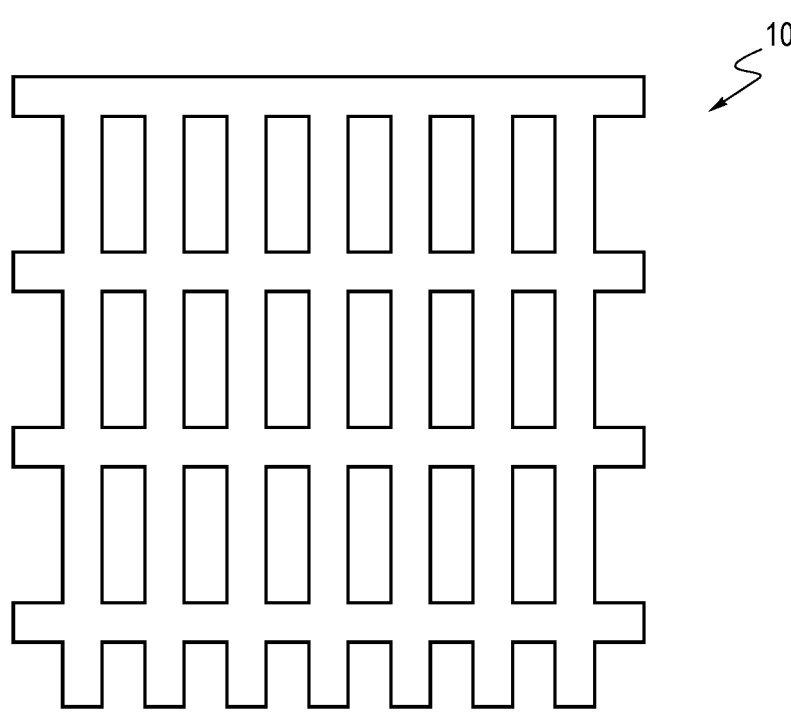
FIG. 10 is an illustration of an example grid of an embodiment.
Figure 11:
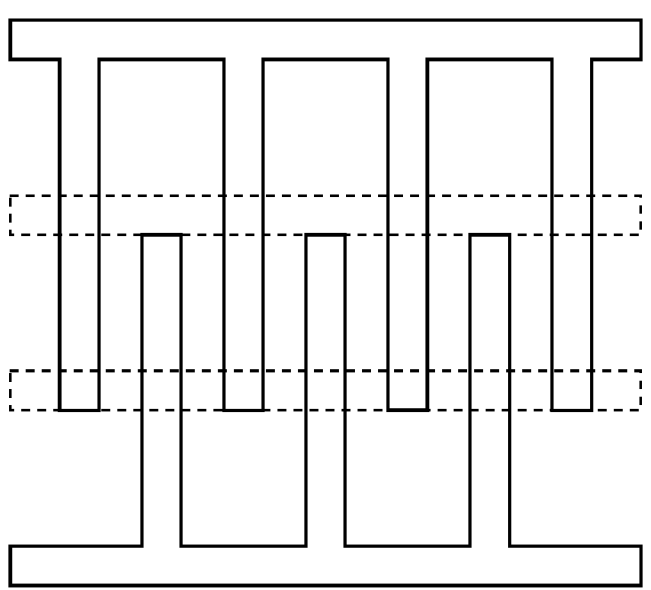
FIG. 11 is an illustration of an interdigitated layout of an embodiment.
Figure 12:
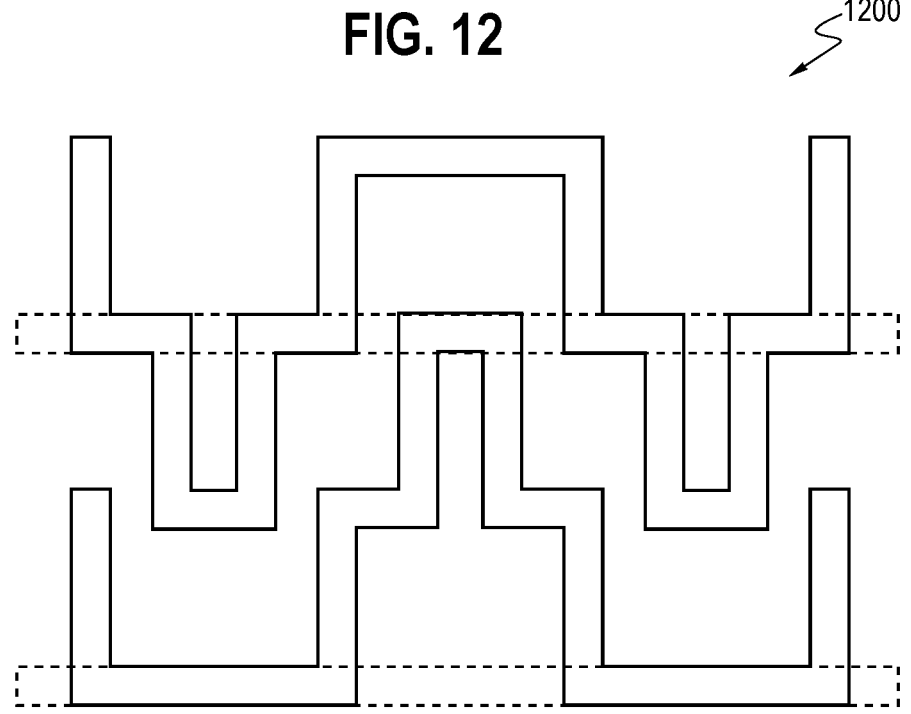
FIG. 12 is an illustration of a staggered serpentine layout of an embodiment.
Figure 13:
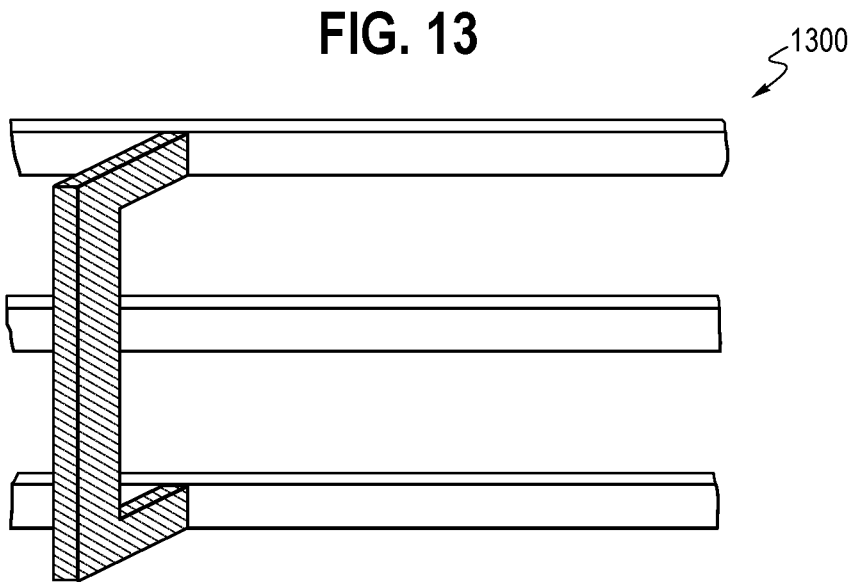
FIG. 13 is an illustration of an interdigitated layout of an embodiment having two vias and three metals.
Figure 14:
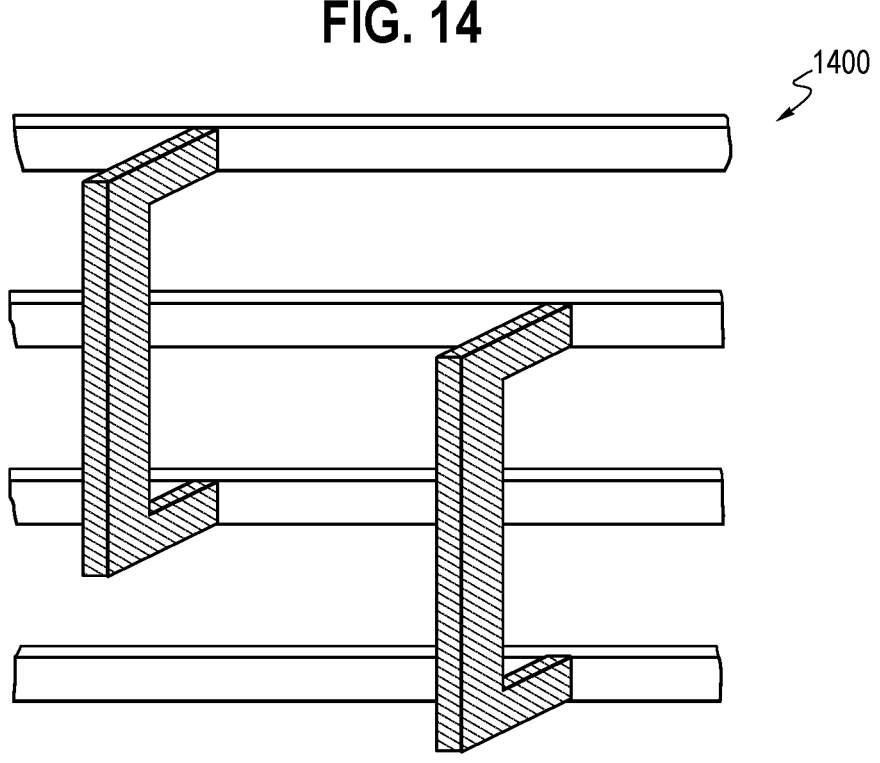
FIG. 14 is an illustration of an interdigitated layout of an embodiment. having three vias and four metals.

FIG. 10 is an illustration of an example grid 1000 that can be used for making various topologies discussed below. FIG. 11 is an illustration of an interdigitated layout 1100 in a chip having three vias and four metals. In one embodiment, this is a topology having the smallest area. FIG. 12 is an illustration of a staggered serpentine layout 1200 in a chip having three vias and four metals. In one embodiment, this is a topology having the smallest area. FIG. 13 is an illustration of an interdigitated layout 1300 in a chip having two vias and three metals. FIG. 14 is an illustration of an interdigitated layout 1300 in a chip having three vias and four metals.

Figure 15:
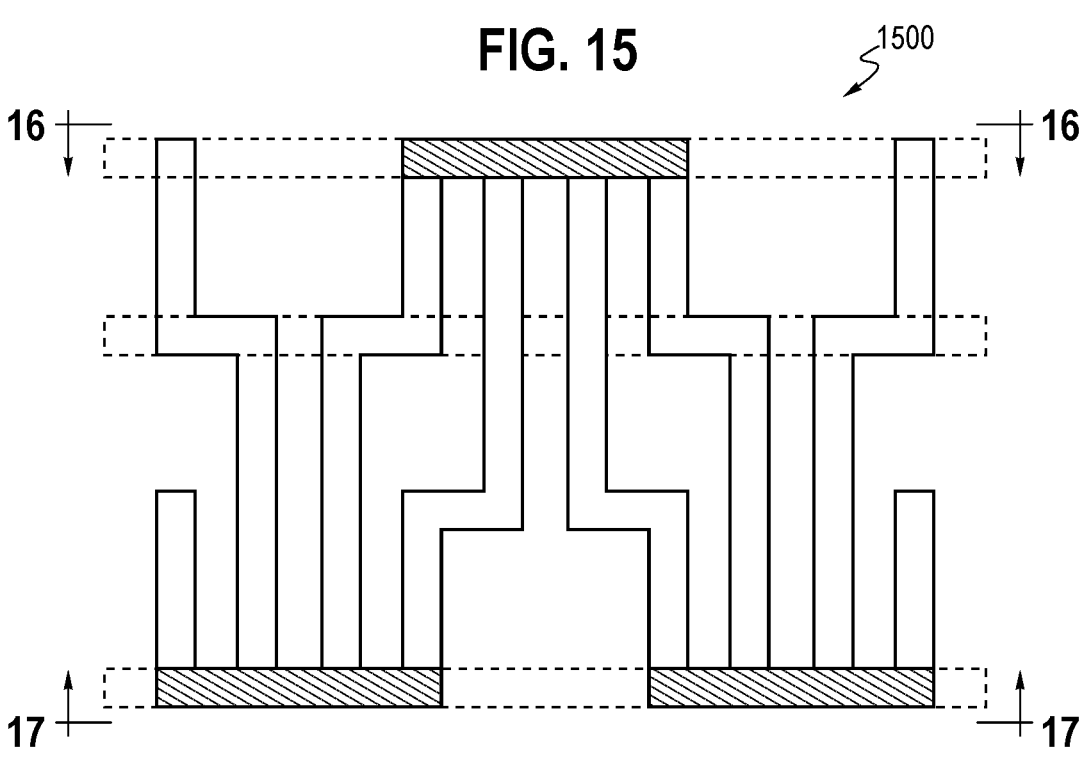
FIG. 15 is an illustration of a staggered serpentine layout of an embodiment having three vias and four metals.
Figure 16:
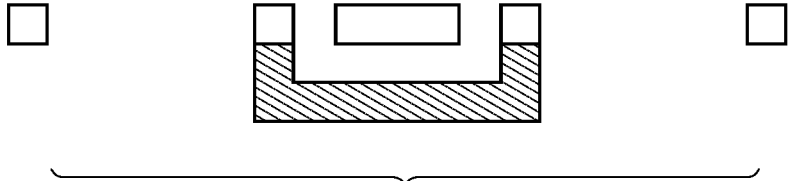
FIG. 16 is a top view of the layout in FIG. 15.
Figure 17:
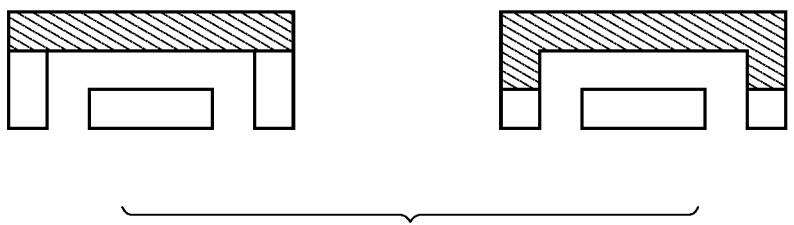
FIG. 17 is a bottom view of the layout in FIG. 15.

FIG. 15 is an illustration of a staggered serpentine layout 1500 in a chip having three vias and four metals. This illustration is a two-dimensional view into a side of the chip. FIG. 16 is a two-dimensional view into a top of the chip, and FIG. 17 is a two-dimensional view into a bottom of the chip.

Figure 18:
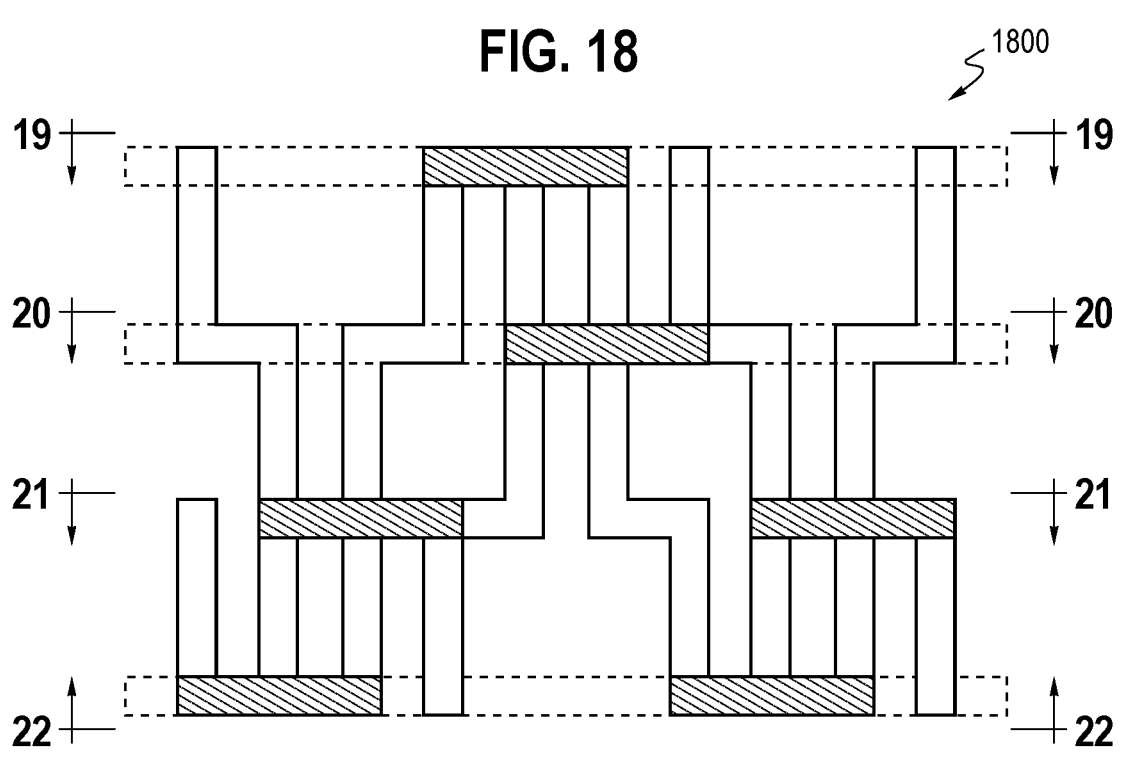
FIG. 18 is an illustration of an x-staggered serpentine layout of an embodiment.
Figure 19:
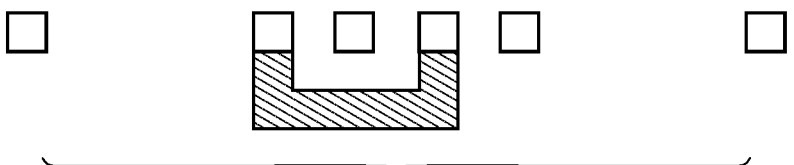
FIG. 19 is a top view of the layout in FIG. 18.
Figure 20:
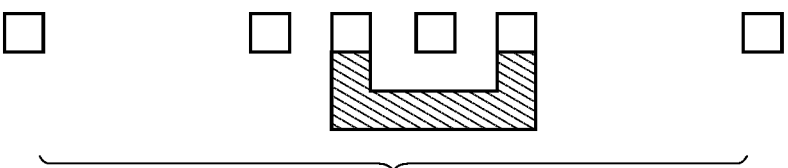
FIG. 20 is a top view of the layout in FIG. 18 at a second-highest metal layer.
Figure 21:
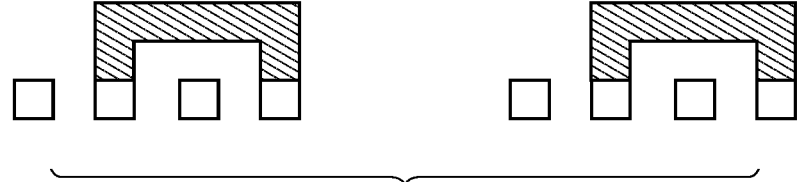
FIG. 21 is a bottom view of the layout in FIG. 18 at the second-lowest metal layer.
Figure 22:
FIG. 22 is a bottom view of the layout in FIG. 18.

FIG. 18 is an illustration of an x-staggered serpentine layout 1800 in a chip having three vias and four metals. This illustration is a two-dimensional view into a side of the chip. In this embodiment, there is a movement in the metals to connect every other layer other than the top and bottom layers. This embodiment may sacrifice a full impact of a break anywhere in the serpentine. FIG. 19 is a two-dimensional view into a top of the chip. FIG. 20 is a two-dimensional view into a top of the chip at the second-highest metal. FIG. 21 is a two-dimensional view into a bottom of the chip at the second-lowest metal. FIG. 22 is a two-dimensional view into a bottom of the chip.

Figure 23:
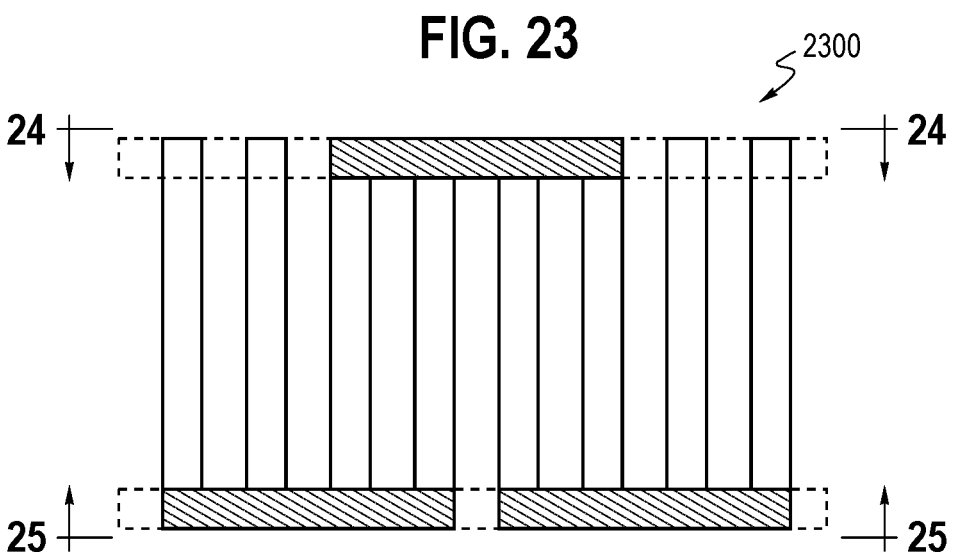
FIG. 23 is an illustration of a serpentine layout of an embodiment having one via and two metals.
Figure 24:
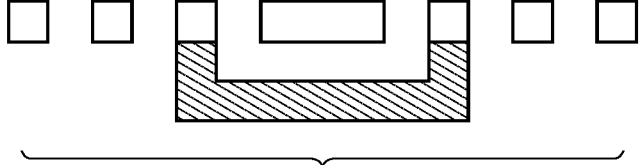
FIG. 24 is a top view of the layout in FIG. 23.
Figure 25:
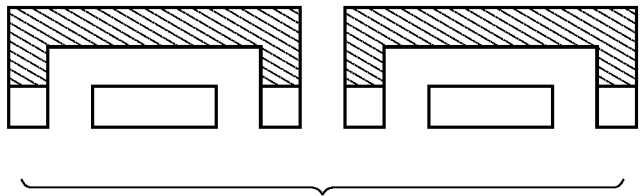
FIG. 25 is a bottom view of the layout in FIG. 23.

FIG. 23 is an illustration of a serpentine layout 2300 in a chip having one via and two metals. This illustration is a two-dimensional view into a side of the chip. FIG. 24 is a two-dimensional view into a top of the chip. FIG. 25 is a two-dimensional view into a bottom of the chip.

Figure 26:
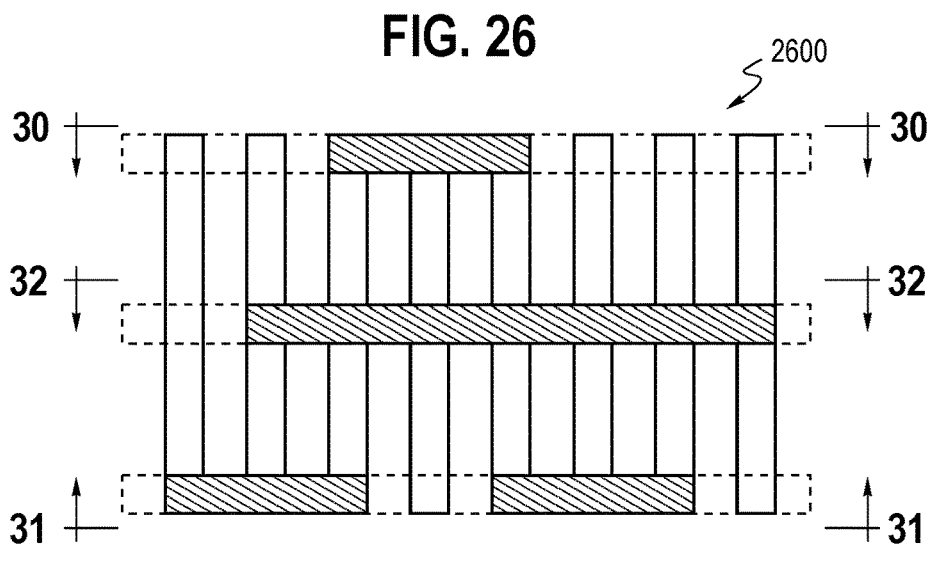
FIG. 26 is an illustration of an x-staggered serpentine layout of an embodiment having two vias and three metals.
Figure 27:
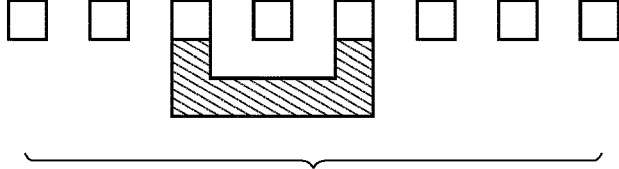
FIG. 27 a top view of the layout in FIG. 26.
Figure 28:
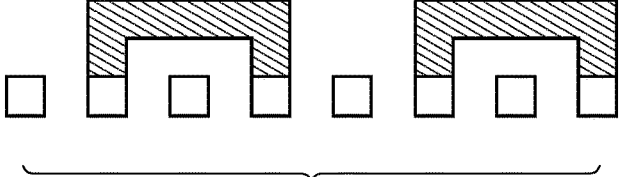
FIG. 28 is a bottom view of the layout in FIG. 26 facing a middle metal.
Figure 29:
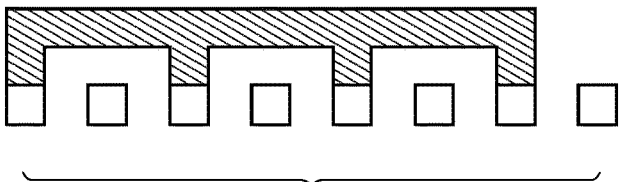
FIG. 29 is a bottom of the layout in FIG. 26.

FIG. 26 is an illustration of an x-staggered serpentine layout 2600 in a chip having two vias and three metals. This illustration is a two-dimensional view into a side of the chip. This embodiment may sacrifice some sensitivity on the top/via area for increased detection in the capacitive regions (instead of every other gap between the finger being in the sensing, now every gap is in the sensing). FIG. 27 a two-dimensional view into a top of the chip. FIG. 27 is a two-dimensional view into a top of the chip at the second-highest metal. FIG. 28 is a two-dimensional view into a bottom of the chip, facing a middle metal. FIG. 29 is a two-dimensional view into a bottom of the chip.

There are many other alternatives that can be used with these embodiments. For example, continuity (crack) detection can happen in both the clockwise and counter-clockwise directions, such that the electrical difference between the two can be compared for crack detection. With no crack, the conductivities should be the same or very similar, but with a crack, they should differ based on direction. As another alternative, a comparison can be made over time, such that the detection for a current iteration can be compared to a previous iteration to see if a shift exceeds a threshold. As yet another alternative, fractional components of the structure can be compared, such that all parts of matching/similar impedances can be compared to each other, where any discrepancy would be indicative of a crack. For example, one half of the structure can be compared to the other half, or one side can be compared to the side opposite of it (e.g., four parts total), or other sub parts could be multiplexed into a comparison circuit and compared (e.g., comparing half of one side to another half of a similar side, or the other half on the same side, etc.). By comparing smaller parts of the detection circuit to each other, sensitivity to issues increases, making it easier to find cracks, albeit possibly at the cost of additional routing and multiplexing circuitry.

It is intended that the foregoing detailed description be understood as an illustration of selected forms that the invention can take and not as a definition of the invention. For example, it will be understood that the present technology may be used in any wafer-to-wafer bonding application, not just for a wafer having dies with CMOS circuitry bonded to a wafer having memory or NAND dies. It is only the following claims, including all equivalents that are intended to define the scope of the claimed invention. Finally, it should be noted that any aspect of any of the embodiments described herein can be used alone or in combination with one another.

What is claimed is:

1. An integrated circuit comprising:
a memory die;
a control die comprising control circuitry for the memory die, wherein the memory die and the control die are bonded together at a bonding interface;
an edge seal surrounding the memory die and the control die, wherein the edge seal comprises a plurality of rings perpendicular to the bonding interface, and wherein the plurality of rings comprises an inner seal ring, which is farther away than any other ring of the plurality of rings from a scribe line where the integrated circuit was diced; and
a plurality of interdigitated capacitors located in an inner portion of the inner seal ring;
wherein the plurality of interdigitated capacitors are perpendicular to the bonding interface;
wherein the plurality of interdigitated capacitors are configured to detect a discontinuity in the bonding interface between the memory die and the control die; and
wherein the plurality of interdigitated capacitors comprise a plurality of spaced apart, mating fingers.

2. The integrated circuit of claim 1, wherein the plurality of interdigitated capacitors are vertically positioned.

3. The integrated circuit of claim 1, wherein the plurality of interdigitated capacitors are horizontally positioned.

4. The integrated circuit of claim 1, wherein the plurality of interdigitated capacitors are located in the memory die.

5. The integrated circuit of claim 1, wherein the plurality of interdigitated capacitors are located in the control die.

6. The integrated circuit of claim 1, wherein the plurality of interdigitated capacitors are located in the memory die and the control die.

7. The integrated circuit of claim 1, wherein the control circuitry comprises complementary metal-oxide-semiconductor (CMOS) circuitry.

8. An integrated circuit comprising:
a first die formed in a first silicon wafer;
a second die formed in a second silicon wafer, wherein the first and second silicon wafers and the first and second dies are bonded together at a bonding interface, thereby electrically coupling the first die to the second die;

an edge seal surrounding the first die and the second die, wherein the edge seal comprises a plurality of rings perpendicular to the bonding interface, and wherein the plurality of rings comprises an inner seal ring, which is farther away than any other ring of the plurality of rings from a scribe line where the integrated circuit was diced; and
means for detecting a discontinuity in the bonding interface between the first and second dies, wherein the means for detecting comprises a plurality of interdigitated capacitors comprising a plurality of spaced apart, mating fingers, wherein the plurality of interdigitated capacitors are located in an inner portion of the inner seal ring and are perpendicular to the bonding interface.

9. In an integrated circuit comprising a memory die; a control die comprising control circuitry for the memory die, wherein the memory die and the control die are bonded together at a bonding interface; an edge seal surrounding the memory die and the control die, wherein the edge seal comprises a plurality of rings perpendicular to the bonding interface, and wherein the plurality of rings comprises an inner seal ring, which is farther away than any other ring of the plurality of rings from a scribe line where the integrated circuit was diced, and a plurality of interdigitated capacitors located in an inner portion of the inner seal ring, a method comprising:
receiving a voltage across the plurality of interdigitated capacitors; and
providing an indication of a discontinuity in the bonding interface between the memory die and the control die;
wherein the plurality of interdigitated capacitors are perpendicular to the bonding interface and comprise a plurality of spaced apart, mating fingers.

10. The method of claim 9, wherein the plurality of interdigitated capacitors are vertically positioned.

11. The method of claim 9, wherein the plurality of interdigitated capacitors are horizontally positioned.

12. The method of claim 9, wherein the plurality of interdigitated capacitors are located in the memory die.

13. The method of claim 9, wherein the plurality of interdigitated capacitors are located in the control die.

14. The method of claim 9, wherein the plurality of interdigitated capacitors are located in the memory die and the control die.

15. The method of claim 9, wherein the control circuitry comprises complementary metal-oxide-semiconductor (CMOS) circuitry.

* * * * *